United States Patent [19]

Lin

[11] Patent Number: 5,651,858

[45] Date of Patent: Jul. 29, 1997

[54] METHOD FOR FORMING A TAPERED OPENING IN SILICON

[75] Inventor: Jung-Hui Lin, Gilbert, Ariz.

[73] Assignee: Motorola Inc., Schaumburg, Ill.

[21] Appl. No.: 690,192

[22] Filed: Jul. 26, 1996

Related U.S. Application Data

[63] Continuation of Ser. No. 399,245, Mar. 6, 1995.

[51] Int. Cl.$^6$ ............................................. H01L 21/306
[52] U.S. Cl. ......................... 156/646.1; 156/662.1; 437/981
[58] Field of Search ..................... 437/66, 77, 947, 437/981; 156/643.1, 646.1, 662.1

[56] References Cited

U.S. PATENT DOCUMENTS

| | | | |
|---|---|---|---|
| 4,690,729 | 9/1987 | Douglas | 156/662 |
| 4,855,017 | 8/1989 | Douglas | 156/662 |
| 4,885,054 | 12/1989 | Shibagaki | 156/662 |
| 5,118,384 | 6/1992 | Harmon et al. | 156/643 |

OTHER PUBLICATIONS

Ohki et al., "Cavernous Undercuts Appearing In Reactive Ion Etched Submicron-Wide Deep Trenches", J. Vac. Sci. Technology B5(6), Nov./Dec. 1987, pp. 1611–1616.

Cooper et al., "Magnetically Enhanced Rie Etching of Submicron Silicon Trenches", Society of Photo–Optical Instrumentation Engineers, SPIE vol. 1392 Adv. Techniques for Integrated Cir.Proc., '90, pp. 253–264.

Lii et al., "Magnetic Enhanced Rie of Silicon Deep Trench", Extended Abstracts of the Electrochemical Society, vol. 90-1, 1990, pp. 178–179.

Lee et al., "Rie Lags In Reactive Ion Etching", Extended Abstracts of the Electrochemical Society, vol. 90-1, 1990, pp. 124–125.

Bondur et al.,"Magnetically Enhanced Reactive Ion Etching (Merie) Applied to Deep . . . ," Extended Abstracts of the Electrochemical Society, vol. 90-1, 1990, pp. 176–177.

Chin et al., "Structural Effects On A Submicron Trench Process", Journal of the Electrochemical Society, vol. 132, No. 7, 1985, pp. 1705–1707.

Physical and Electrical Characteristics of Submicron Trench Capacitors; Cooper et al; The Electrochemical Society, Extended Abstracts, vol. 90-2, Abstract No. 286; 1990, pp. 410–411.

High Voltage Deep Trench Isolation Process Options; Robb et al; The Electrochemical Society; Extended Abstracts, vol. 90-2, Abstract No. 285; 1990, pp. 408–409.

A NF3/Ar Isolation Trench Etch in a Magnetron Reactor; Armacost et al; The Electrochemical Society, Extended Abstracts, vol. 90-2, Abstract No. 294; 1990 pp. 422–423.

*Primary Examiner*—John Niebling
*Assistant Examiner*—Thomas G. Bilodeau

[57] ABSTRACT

A method for forming a tapered opening in a silicon substrate uses $NF_3$ and HBr. The $NF_3$/HBr plasma etch allows both a good taper profile, 85° to 60°, as well as a good etch rate, approximately 2500 to 3000 Å/minute. Although not limited to a particular trench size, the present method is well suited for forming openings smaller than 0.45 μm.

5 Claims, 1 Drawing Sheet

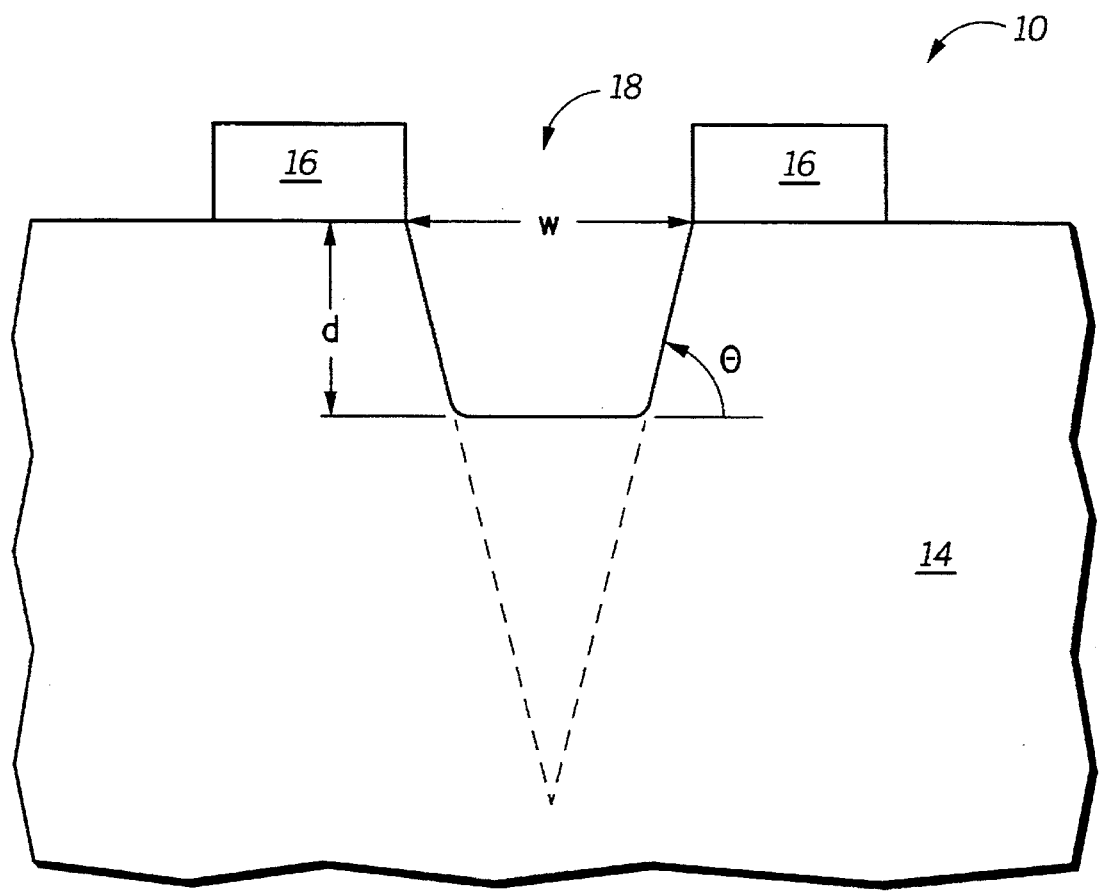
FIGURE

METHOD FOR FORMING A TAPERED OPENING IN SILICON

This application is a continuation of prior application Ser. No. 08/399,245, filed Mar. 6, 1995.

FIELD OF THE INVENTION

The present invention relates generally to semiconductor processing and more specifically to a method for forming tapered openings in a semiconductor substrate.

BACKGROUND OF THE INVENTION

In current semiconductor processing, it is typical and often desired to form shallow trenches to form trench isolations. These trenches are now scaled to submicron dimensions. The trench profile must be well controlled in order to obtain trench isolations with low leakage and high breakdown voltages.

Trench isolation techniques involve filling the trench with an dielectric, such as tetra ethyl ortho silicate (TEOS). During the deposition of the TEOS into the trench, voiding problems can often occur wherein the top of the trench is filled before the bulk volume of the trench is completely filled. Voiding typically occurs when the trench sidewall is straight or vertical, defined as $\geq 85°$. These voids pose a reliability problem because in subsequent processing steps, polysilicon stringers are left in the voids which can cause electrical shorts. One way to resolve this voiding problem is to increase the width of the trench. This solution is impractical and inconsistent with advancing technology where devices are being scaled down in size rather than up. Thus, real estate on the silicon substrate is valuable and cannot be wasted. An alternative solution to the voiding problem is to taper the sidewalls of the trench to promote uniform filling. A taper angle of less than 85°, as measured from the horizontal plane, is desired for uniform filling of a trench opening that is less than 0.45 μm wide.

Currently, an etching process using a chlorine and hydrogen bromide ($Cl_2$/HBr) chemistry is used to form trench openings in silicon. This chemistry yields a good etch rate of approximately 2600 Å/minute which is acceptable for a manufacturing environment. A problem with this chemistry is that the resulting trench opening profile is not sufficiently tapered for openings smaller than 0.45 μm. This method only yields trench openings having a sidewall taper angle of approximately 85°, which is nearly vertical. This angle does not allow uniform filling of the trench to eliminate the voiding problem as desired if the trench opening is less than 0.45 μm. Thus, while the $Cl_2$/HBr chemistry is sufficient for forming trenches large, this method does not yield the desired result upon a scaling down of geometries.

A second etching process uses a nitrogen trifluoride and argon ($NF_3$/Ar) chemistry to form the trench openings in silicon. While this method yields an opening having a sidewall taper angle of approximately 82°, which is considered a good profile, this method has the drawback of a very low throughput. Using the $NF_3$/Ar chemistry requires approximately 9 minutes to form an opening of 0.5 μm deep, which is a typically desired depth. Furthermore, adjusting the taper profile is not easily achievable or controllable with this chemistry.

While it may seem trivial to strive for a few degrees in the sidewall taper angle, on a submicron level, a change of a mere couple of degrees is critical in terms of having a successful process or an unacceptable process. However, determining a method for achieving that small change in the taper angle is often not a trivial thing due to constraints in geometries, materials, and chemistries involved. Nevertheless, it is desirable to find a method for forming tapered trenches that yield both an acceptable throughput as well as a good taper profile to eliminate voiding in the trench fill.

BRIEF DESCRIPTION OF THE DRAWINGS

The FIGURE illustrates, in cross-section, a desired taper profile for an opening in a silicon substrate in accordance with the present invention.

It is important to point out that the illustration may not necessarily be drawn to scale, and that there may be other embodiments of the present invention which are not specifically illustrated.

DETAILED DESCRIPTION OF A PREFERRED EMBODIMENT

The present invention provides a method for forming tapered openings in a silicon substrate using a particular etching chemistry. The combination of a nitrogen trifluoride and hydrogen bromide ($NF_3$/HBr) plasma etch allows both a good taper profile as well as a good etch rate, yielding a desirable manufacturing process having controllability and quick cycle time. Although not limited to a trench size, method of the present invention is particularly well suited for openings smaller than 0.45 μm. These and other features, and advantages, will be more clearly understood from the following detailed description taken in conjunction with the accompanying drawings.

It has been found that a plasma of $NF_3$/HBr provides all the advantages desired in etching a tapered opening 18 for silicon processing. First, a silicon substrate 14 is placed inside the process chamber of the plasma etch equipment. An example of a suitable etch machine for practicing the present invention is Applied Materials Precision 5000™. Operation of the equipment is known to one practicing in this area, and operation manuals provided with the equipment can be consulted. The silicon substrate may have already gone through previous processing steps, such that the substrate has on its top surface, one or several dielectric layers as insulators, a hard mask 16 overlying the dielectric layers wherein this hard mask may contain another organic dielectric material different from the underlying dielectric layers, and openings in the dielectric layers and the hard mask to expose a portion of the underlying silicon substrate. The purpose of the hard mask is to protect the underlying substrate during plasma etch.

The power setting on the equipment is set to a preselected value. It has been found that varying the RF power, on the Applied Materials Precision 5000™, affects the resulting profile of the tapered opening. As the power is increased, the taper angle θ of the opening decreases, wherein a smaller angle translates to a more tapered opening. A preferred range of power for practicing the invention is approximately 300 to 550 Watts. Using power setting in this range should result in a tapered opening having a taper angle θ in an optimal range of 60° to 85°.

In addition to the power setting, the pressure of the process can also be set. A preselected pressure of 100 millitorr was used in a reduction to practice, but this value should in no way be considered limiting. The pressure setting may be varied to further adjust the resulting profile of the opening 18.

Flows of $NF_3$ and HBr are introduced into the process chamber. These flows need not be introduced simultaneously in practicing the invention. However, as a practical matter, these two flows would be introduced within a fairly short time of each other, such as within 60 seconds of each other. For practical purposes, the introduction of the flows would be done simultaneously or within 5 to 10 seconds of each other. The order of the introduction of the two flows is not critical. In the reduction to practice, a flow rate of 5 cubic centimeter (cc) per minute of $NF_3$ was used, while the HBr flow rate was 40 cc/min. This translates into an $NF_3$/HBr ratio of 1:8. However, a person practicing the invention is not limited to these specific flow rates or this ratio because they may be varied to adjust the taper profile. In particular, increasing the flow of $NF_3$ relative to the flow of HBr has been found to reduce the taper angle $\theta$ yielding a more tapered opening. For example, it has been found in a reduction to practice that doubling the flow rate of $NF_3$ while keeping all other parameters constant reduces the angle from 82° to 60°. A practicable setting for the $NF_3$/HBr ratio ranges from 1:8 to 1:4.

Once the flows of both $NF_3$ and HBr are stabilized and all other parameter settings on the equipment have achieved steady state conditions, a plasma generated with the $NF_3$ and HBr input gases is ignited in the process chamber. This plasma etches the tapered opening 18 in the portion of the silicon substrate 14 that is not covered by the hard mask 16. While in no way limited to submicron wide openings, the present invention has been found to be particularly effective for etching an opening having a width w that is less than 0.45 μm but still having a taper angle $\theta$ ranging from 85° to 60°. The present invention has an etch rate of approximately 2500 to 3000 Å/minute. Thus, for an opening having a depth d of approximately 0.5 μm, the etch should take approximately 1.5 minutes. Of course, the depth d of the opening is physically limited to 0.5·w·tan $\theta$, which translates to approximately 1.6 μm for an opening 0.45 μm with a taper angle of 82°. However, in practice, the depth of an opening would range from 0.3 μm to 1.0 μm for a typical semiconductor device application.

The combination of $NF_3$ and HBr in the plasma etch to form tapered openings yields a manufacturably desirable process having a good etch rate and good controllability on the taper profile. First, the etch rate of the $NF_3$/HBr plasma is comparable to that of the $Cl_2$/HBr plasma of the prior art. It is believed that the presence of $NF_3$ in the plasma endows the process with the good etch rate because use of $NF_3$ alone has been observed to yield a fairly quick etch process. However, $NF_3$ alone causes an undercut problem in the opening which is undesirable. The presence of HBr in the present process, however, appears to solve the undercut problem created by $NF_3$. Practicing the present invention yields the desired taper profile for openings less than 0.45 μm wide, which has not been possible with the $Cl_2$/HBr plasma of the prior art. As mentioned previously, a good taper profile previously required using an $NF_3$/Ar plasma but doing so meant a large sacrifice in cycle time due to the slow etch rate of this chemistry. However, the present invention provides a fast etch rate. Thus, practicing the present invention provides all of the advantages associated with the prior art processes but with none of their disadvantages.

The foregoing description and illustrations contained herein demonstrate many of the advantages associated with the present invention. Thus it is apparent that there has been provided, in accordance with the invention, a method for forming an opening in a silicon substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the power, the pressure, and the ratio of $NF_3$/HBr may all be varied in the process to fine tune the taper profile. Alternatively, only one setting may be varied while the remaining parameters are kept constant to adjust the taper profile. Therefore, it is intended that this invention encompasses all such variations and modifications falling within the scope of the appended claims.

I claim:

1. A method for forming a trench in a semiconductor substrate, comprising the steps of:

providing a silicon substrate having a dielectric layer overlying a surface of the silicon substrate, the dielectric layer having a first opening therein to expose a portion of the silicon substrate; and etching the exposed portion of the silicon substrate to form the trench, the trench having a depth ranging from 0.3 μm to 1.0 μm, a width of less than 0.45 μm, and a sidewall taper angle relative to the surface of the silicon substrate ranging from 82° to 60°, wherein only a plasma generated with etch gases consisting essentially of $NF_3$ and HBr is used to etch the trench.

2. The method of claim 1, wherein the step of etching is further characterized as etching the exposed portion of the silicon substrate at a power ranging from approximately 350 to 550 Watts.

3. The method of claim 1, wherein the step of etching is further characterized as etching the exposed portion of the silicon substrate with a flow rate ratio of $NF_3$ to HBr ranging from approximately 1:8 to 1:4.

4. The method of claim 3, wherein the step of etching is further characterized as etching the exposed portion of the silicon substrate with an etch rate ranging from approximately 2500 to 3000 Å/minute.

5. The method of claim 1, wherein the step of etching is further characterized as etching the exposed portion of the surface and the underlying portion of the silicon substrate at a pressure of 100 millitorr.

* * * * *